(12) United States Patent
Bao et al.

(10) Patent No.: US 6,424,038 B1
(45) Date of Patent: Jul. 23, 2002

(54) LOW DIELECTRIC CONSTANT MICROELECTRONIC CONDUCTOR STRUCTURE WITH ENHANCED ADHESION AND ATTENUATED ELECTRICAL LEAKAGE

(75) Inventors: Tien-I Bao; Syun-Ming Jang, both of Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/812,029

(22) Filed: Mar. 19, 2001

(51) Int. Cl.[7] ............................................... H01L 23/48
(52) U.S. Cl. ..................... 257/741; 438/618; 438/637; 438/638
(58) Field of Search ................. 438/627, 628, 438/629, 630, 631, 637, 638, 639, 640, 641, 258, 618, 622, 671, 687

(56) References Cited

U.S. PATENT DOCUMENTS

| 6,071,809 A | 6/2000 | Zhao |
| 6,100,184 A | 8/2000 | Zhao et al. |
| 6,232,222 B1 * | 5/2001 | Armacost et al. ............ 438/258 |
| 6,313,028 B2 * | 11/2001 | Huang et al. ................ 438/597 |
| 6,331,479 B1 * | 12/2001 | Li et al. ...................... 438/618 |

* cited by examiner

Primary Examiner—David Nelms
Assistant Examiner—Mai-Huong Tran
(74) Attorney, Agent, or Firm—Randy W. Tung

(57) ABSTRACT

Within both a microelectronic conductor structure and a method for forming the microelectronic conductor structure there is employed a silicon carbide layer having formed thereupon a silicon nitride layer in turn having formed thereupon a patterned low dielectric constant dielectric layer in turn having formed interposed between its patterns a patterned conductor layer. Within both the microelectronic conductor structure and the method for forming the microelectronic conductor structure, by employing the silicon carbide layer having formed thereupon the silicon nitride layer in turn having formed thereupon the patterned low dielectric constant dielectric layer, the microelectronic conductor structure is formed with enhanced adhesion and attenuated electrical leakage.

16 Claims, 2 Drawing Sheets

LOW DIELECTRIC CONSTANT MICROELECTRONIC CONDUCTOR STRUCTURE WITH ENHANCED ADHESION AND ATTENUATED ELECTRICAL LEAKAGE

BACKGROUND OF THE INVENTION

1. Field of the Invention

The present invention relates generally to microelectronic conductor structures, as employed within microelectronic fabrications. More particularly, the present invention relates to low dielectric constant microelectronic conductor structures with enhanced adhesion and attenuated electrical leakage, as employed within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly common in the art of microelectronic fabrication to employ when fabricating microelectronic fabrications microelectronic dielectric layers formed of comparatively low dielectric constant dielectric materials. For reference purposes, comparatively low dielectric constant dielectric materials as employed for forming microelectronic dielectric layers within microelectronic fabrications are intended as dielectric materials typically having dielectric constants in a range of from about 2.0 to about 4.0. For comparison purposes, conventional dielectric materials as employed for forming microelectronic dielectric layers within microelectronic fabrications, such as but not limited to conventional silicon oxide dielectric materials, conventional silicon nitride materials and conventional silicon oxynitride materials as employed for forming microelectronic dielectric layers within microelectronic fabrication, typically have dielectric constants in a range of from about 4.0 to about 8.0.

Comparatively low dielectric constant dielectric materials as employed for forming microelectronic dielectric layers within microelectronic fabrications may include, but are not limited to, spin-on-polymer (SOP) dielectric materials, spin-on-glass (SOG) dielectric materials, amorphous carbon dielectric materials, fluorosilicate glass (FSG) dielectric materials and aerogel (i.e., air or insulating gas entrained) dielectric materials. As is understood by a person skilled in the art, comparatively low dielectric constant dielectric materials are desirable within the art of microelectronic fabrication for forming microelectronic dielectric layers interposed between the patterns of patterned microelectronic conductor layers within microelectronic fabrications insofar as within such applications comparatively low dielectric constant dielectric materials provide microelectronic fabrications with enhanced microelectronic fabrication speed, reduced patterned microelectronic conductor layer parasitic capacitance and reduced patterned microelectronic conductor layer cross-talk.

While comparatively low dielectric constant dielectric materials are thus desirable in the art of microelectronic fabrication for forming microelectronic dielectric layers interposed between the patterns of patterned microelectronic conductor layers within microelectronic fabrications, comparatively low dielectric constant dielectric constant dielectric materials are nonetheless not entirely without problems within microelectronic fabrications when employed for forming microelectronic dielectric layers interposed between the patterns of patterned microelectronic conductor layers within microelectronic fabrications. In that regard, and in particular with respect to damascene methods for forming within microelectronic fabrications microelectronic conductor structures comprising patterned microelectronic conductor layers having formed interposed between their patterns microelectronic dielectric layers formed of comparatively low dielectric constant dielectric materials, there is often observed within such microelectronic conductor structures decreased adhesion and enhanced electrical leakage.

It is thus desirable in the art of microelectronic fabrication to provide microelectronic conductor structures, and methods for fabrication thereof, comprising patterned microelectronic conductor layers having formed interposed between their patterns microelectronic dielectric layers formed of comparatively low dielectric constant dielectric materials, with enhanced adhesion and attenuated electrical leakage.

It is towards the foregoing object that the present invention is directed.

Various methods have been disclosed in the art of microelectronic fabrication for forming microelectronic conductor structures, and in particular microelectronic conductor structures comprising patterned microelectronic conductor layers having formed interposed between their patterns microelectronic dielectric layers formed of comparatively low dielectric constant dielectric materials, with desirable properties in the art of microelectronic fabrication.

For example, Zhao et al., in U.S. Pat. No. 6,100,184, discloses a method for efficiently forming within a microelectronic fabrication a microelectronic conductor structure comprising a patterned microelectronic conductor stud layer contacting a patterned microelectronic conductor interconnect layer, wherein each of the patterned microelectronic conductor stud layer and the patterned microelectronic interconnect layer has formed adjacent thereto a microelectronic dielectric layer formed of a comparatively low dielectric constant dielectric material. In order to realize the foregoing object, the method comprises a dual damascene method which employs: (1) a pair of patterned first microelectronic dielectric layers formed of a first comparatively low dielectric constant dielectric material which defines a via, having formed thereover; (2) a pair of patterned second microelectronic dielectric layers formed of a second low dielectric constant dielectric material which defines a trench contiguous with the via, and further wherein the patterned microelectronic conductor stud layer which contacts the patterned microelectronic conductor interconnect layer is formed within the via contiguous with the trench while employing a single chemical mechanical polish (CMP) planarizing method.

In addition, Zhao, in U.S. Pat. No. 6,071,809, discloses a related dual damascene method for forming within a microelectronic fabrication a microelectronic conductor structure comprising a patterned microelectronic conductor stud layer contiguous with a patterned microelectronic conductor interconnect layer, each having formed adjacent thereto a microelectronic dielectric layer formed of a comparatively low dielectric constant dielectric material, in part absent delamination within the microelectronic conductor structure. To realize the foregoing object, the dual damascene method employs when forming within the microelectronic conductor structure while employing a single chemical mechanical polish (CMP) planarizing method the patterned microelectronic conductor stud layer contiguous with the patterned microelectronic conductor interconnect layer a composite hard mask layer/polish stop layer comprising a silicon nitride polish stop material layer having formed thereupon a silicon oxide hard mask material layer.

Desirable in the art of microelectronic fabrication are additional methods through which there may be formed within microelectronic fabrications microelectronic conductor structures comprising patterned microelectronic conductor layers having formed interposed between their patterns microelectronic dielectric layers formed of low dielectric constant dielectric materials, with enhanced adhesion and attenuated electrical leakage.

It is towards the foregoing object that the present invention is directed.

SUMMARY OF THE INVENTION

A first object of the present invention is to provide a microelectronic conductor structure and a method for forming the microelectronic conductor structure.

A second object of the present invention is to provide a microelectronic conductor structure and a method for forming the microelectronic conductor structure in accord with the first object of the present invention, wherein the microelectronic conductor structure is formed with enhanced adhesion and attenuated electrical leakage.

A third object of the present invention is to provide a microelectronic conductor structure and a method for forming microelectronic conductor structure in accord with the first object of the present invention and the second object of the present invention, wherein the method is readily commercially implemented.

In accord with the objects of the present invention, there is provided by the present invention a microelectronic conductor structure and a method for forming the microelectronic conductor structure.

In accord with the objects of the present invention, the microelectronic conductor structure of the present invention in a first instance comprises a substrate. The microelectronic conductor structure of the present invention also comprises formed over the substrate a silicon carbide layer. The microelectronic conductor structure of the present invention further also comprises formed upon the silicon carbide layer a silicon nitride layer. The microelectronic conductor structure of the present invention still further also comprises formed upon the silicon nitride layer a patterned low dielectric constant dielectric layer. Finally, the microelectronic conductor structure in accord with the present invention yet still further also comprises formed interposed between the patterns of the patterned low dielectric constant dielectric layer a patterned conductor layer.

The microelectronic conductor structure in accord with the present invention contemplates at least one method for forming the microelectronic conductor structure in accord with the present invention.

The present invention provides a microelectronic conductor structure and a method for forming the microelectronic conductor structure, wherein the microelectronic conductor structure comprises a patterned microelectronic conductor layer having interposed between its patterns a dielectric layer formed of a low dielectric constant dielectric material, where the microelectronic conductor structure is formed with enhanced adhesion and attenuated electrical leakage.

The present invention realizes the foregoing objects by employing when forming the microelectronic conductor structure in accord with the present invention, and formed over a substrate, a silicon carbide layer, in turn having formed thereupon a silicon nitride layer, in turn having formed thereupon a patterned low dielectric constant dielectric layer, finally in turn having formed interposed between its patterns a patterned conductor layer.

The method of the present invention is readily commercially implemented.

As will be illustrated in greater detail within the context of the Description of the Preferred Embodiment, as set forth below, the present invention employs methods and materials as are generally known in the art of microelectronic fabrication, but employed within the context of a specific process ordering to provide: (1) a microelectronic conductor structure in accord with the present invention; and (2) a method for forming a microelectronic conductor structure in accord with the present invention. Since it is thus a specific process ordering of methods and materials which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a microelectronic conductor structure and a method for forming the microelectronic conductor structure, wherein the microelectronic conductor structure comprises a patterned microelectronic conductor layer having interposed between its patterns a dielectric layer formed of a low dielectric constant dielectric material, where the microelectronic conductor structure is formed with enhanced adhesion and attenuated electrical leakage.

The present invention realizes the foregoing objects by employing when forming the microelectronic conductor structure in accord with the present invention, and formed over a substrate, a silicon carbide layer, in turn having formed thereupon a silicon nitride layer, in turn having formed thereupon a patterned low dielectric constant dielectric layer, finally in turn having formed interposed between its patterns a patterned conductor layer.

Although the preferred embodiment of the present invention illustrates the present invention within the context of a microelectronic conductor structure formed employing a dual damascene method, the present invention provides value when forming microelectronic conductor structures while employing methods including but not limited to damascene methods, dual damascene methods and non-damascene methods (i.e., a patterned low dielectric constant dielectric layer may be formed before or after a patterned conductor layer in accord with the present invention). Similarly, the present invention may be employed for forming with enhanced adhesion and attenuated electrical leakage microelectronic conductor structures within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
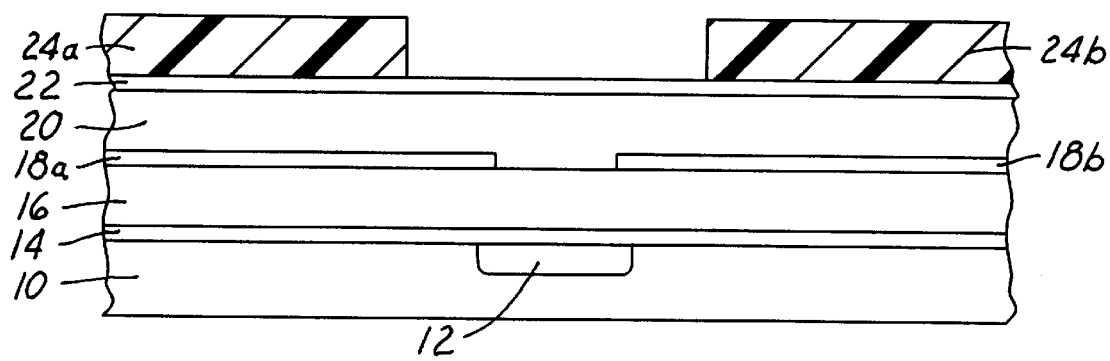
FIG. 1, FIG. 2 and FIG. 3 show a series of schematic cross-sectional diagrams illustrating the results of progressive stages in fabricating within a microelectronic fabrication a microelectronic conductor structure in accord with a preferred embodiment of the present invention.
Figure 2:
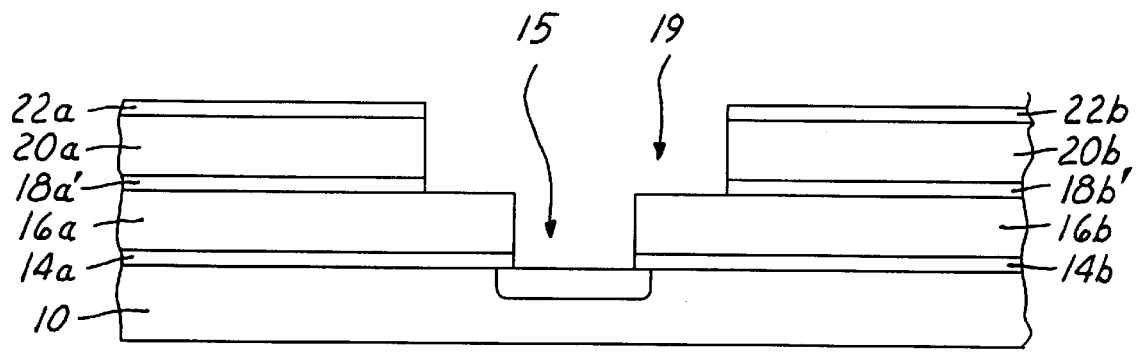
Figure 3:
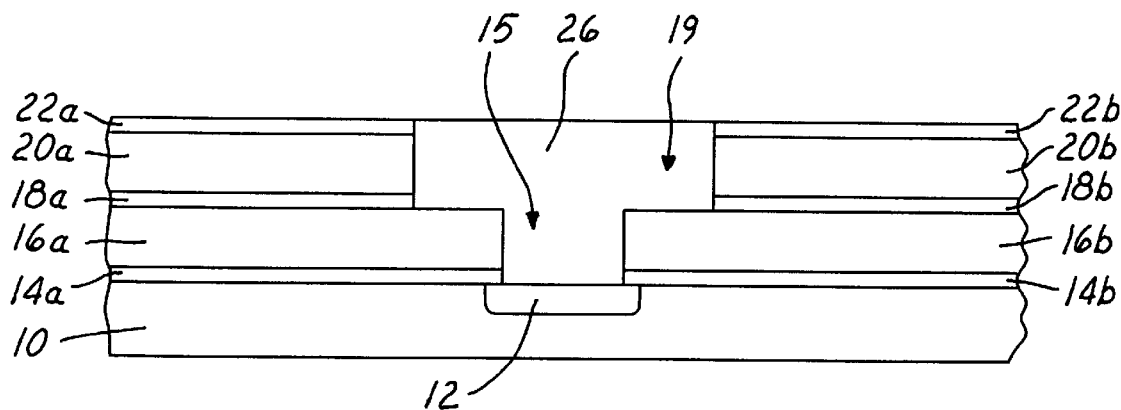

Referring now too FIG. 1 to FIG. 3, there is shown a series of schematic cross-sectional diagrams illustrating the results of progressive stages in fabricating within a microelectronic fabrication a microelectronic conductor structure in accord with a preferred embodiment of the present invention.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed therein a contact region 12.

Within the preferred embodiment of the present invention with respect to the substrate 10, and in accord with the above, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of a substrate alone as employed within the microelectronic fabrication, or in an alternative, the substrate 10 may comprise a substrate as employed within the microelectronic fabrication, where the substrate has formed thereupon and/or thereover any of several additional microelectronic layers as are conventional within the microelectronic fabrication within which is employed the substrate. Analogously with the substrate alone as employed within the microelectronic fabrication, such additional microelectronic layers may be formed from microelectronic materials selected from the group including but not limited to microelectronic conductor materials, microelectronic semiconductor materials and microelectronic dielectric materials.

Similarly, and although also not specifically illustrated within the schematic cross-sectional diagram of FIG. 1, the substrate 10, typically and preferably, but not exclusively, when the substrate 10 consists of or comprises a semiconductor substrate as employed within a semiconductor integrated circuit microelectronic fabrication, has formed therein and/or thereupon microelectronic devices as are conventional within the microelectronic fabrication within which is employed the substrate 10. Such microelectronic devices may include, but are not limited to, resistors, transistors, diodes and capacitors.

Within the preferred embodiment of the present invention with respect to the contact region 12, the contact region is typically and preferably either a conductor contact region or a semiconductor contact region, where either of which is formed of dimensions and of a contact material as is conventional within the microelectronic fabrication within which is employed the substrate 10.

Shown also within the schematic cross-sectional diagram of FIG. 1, and formed upon the substrate 10 as well as the contact region 12, is a blanket first etch stop layer 14 having formed thereupon a blanket first dielectric layer 16.

Within the preferred embodiment of the present invention with respect to the blanket first etch stop layer 14, and in particular in accord with the present invention, the blanket first etch stop layer 14 is typically and preferably formed of a laminate of a silicon carbide layer formed closer the substrate 10 and the contact region 12, where the silicon carbide layer in turn has formed thereupon and laminated thereto a silicon nitride layer formed further from the substrate 10 and the contact region 12.

Within the preferred embodiment of the present invention, the silicon carbide layer may be formed employing any of several methods and materials as are conventional or non-conventional in the art of microelectronic fabrication, including but not limited to chemical vapor deposition (CVD) methods, plasma enhanced chemical vapor deposition (PECVD) methods and physical vapor deposition (PVD) methods. Typically and preferably, the silicon carbide layer is formed to a thickness of from about 10 to about 1000 angstroms and more preferably from about 100 to about 1000 angstroms.

Similarly, within the preferred embodiment of the present invention with respect to the silicon nitride layer, the silicon nitride layer may also be formed employing any of several methods and materials as are conventional or non-conventional in the art of microelectronic fabrication, including but not limited to chemical vapor deposition (CVD) methods, plasma enhanced chemical vapor deposition (PECVD) methods, physical vapor deposition (PVD) methods, thermal nitridation methods and plasma nitridation methods where the latter two methods are directed towards modification of a silicon carbide material from which is formed the silicon carbide layer. As appropriate to individual methods, the silicon nitride layer may be formed in-situ or ex-situ upon the silicon carbide layer. Typically and preferably, the silicon nitride layer is formed to a thickness of from about 10 to about 1000 angstroms and more preferably from about 100 to about 1000 angstroms.

Within the preferred embodiment of the present invention with respect to the blanket first dielectric layer 16, the blanket first dielectric layer 16 is typically and preferably formed of a comparatively low dielectric constant dielectric material selected from the group including but not limited to spin-on-polymer (SOP) dielectric materials (such as but not limited to parylene spin-on-polymer (SOP) dielectric materials, polyarylene ether spin-on-polymer (SOP) dielectric materials, polyimide spin-on-polymer (SOP) dielectric materials, polysulfone spin-on-polymer (SOP) dielectric materials and fluorinated spin-on-polymer (SOP) dielectric material analogs thereof), spin-on-glass (SOG) dielectric materials (such as but not limited to siloxane spin-on-glass (SOG) dielectric materials and silsesquioxane spin-on-glass (SOG) dielectric materials (including but not limited to hydrogen silsesquioxane (HSQ) spin-on-glass (SOG) dielectric materials, carbon bonded organo silsesquioxane spin-on-glass (SOG) dielectric materials and fluorinated silsesquioxane spin-on-glass (SOG) dielectric material analogs), amorphous carbon dielectric materials (including but not limited to non-fluorinated amorphous carbon dielectric materials and fluorinated amorphous carbon dielectric materials), fluorosilicate glass (FSG) dielectric materials and aerogel dielectric materials (including but not limited to air entrained aerogel dielectric materials and insulative gas entrained aerogel dielectric materials) . Typically and preferably, the blanket first dielectric layer 16 is formed to a thickness of from about 1000 to about 20000 angstroms.

Shown also within the schematic cross-sectional diagram of FIG. 1 is: (1) a pair of patterned second etch stop layers 18a and 18b formed upon the blanket first dielectric layer 16; and (2) a blanket second dielectric layer 20 formed upon exposed portions of the pair of patterned second etch stop layers 18a and 18b and the blanket first dielectric layer 16.

Within the preferred embodiment of the present invention, the pair of patterned second etch stop layers 18a and 18b is typically and preferably formed employing methods, materials and thickness dimensions analogous or equivalent to the methods, materials and thickness dimensions employed for forming the blanket first etch stop layer 14. Typically and preferably, the pair of patterned second etch stop layers 18a and 18b define an aperture through which is subsequently etched a via through the blanket first dielectric layer 16 and the blanket first etch stop layer 14 to reach the contact region 12 within the substrate 10.

Similarly, within the preferred embodiment of the present invention, the blanket second dielectric layer 20 is typically and preferably formed employing methods, materials and thickness dimensions analogous or equivalent to the methods, materials and thickness dimensions as are employed for forming the blanket first dielectric layer 16.

Finally, there is also shown within the schematic cross-sectional diagram of FIG. 1 a blanket polish stop layer 22 formed upon the blanket second dielectric layer 20, where the blanket polish stop layer 22 in turn has formed thereupon a pair of patterned photoresist layers 24a and 24b.

Within the preferred embodiment of the present invention, the blanket polish stop layer 22 may be formed of polish stop materials as are conventional in the art of microelectronic fabrication, and will typically and preferably include polish stop materials, such as but not limited to silicon oxide polish stop materials, which are generally not of equivalent composition with the etch stop materials from which are formed the blanket first etch stop layer 14 and the pair of patterned second etch stop layers 18a and 18b. However, the blanket polish stop layer 22 may under certain circumstances be formed employing methods, materials and thickness dimensions analogous or equivalent to the methods, materials and thickness dimensions as employed for forming the blanket first etch stop layer 14 and the pair of patterned second etch stop layers 18a and 18b. Typically and preferably, the blanket polish stop layer 22 is formed to a thickness of from about 100 to about 1000 angstroms.

Finally, within the preferred embodiment of the present invention with respect to the pair of patterned photoresist layers 24a and 24b, the pair of patterned photoresist layers 24a and 24b may be formed of photoresist materials as are conventional in the art of microelectronic fabrication, including photoresist materials selected from the general groups of photoresist materials including but not limited to positive photoresist materials and negative photoresist materials. Typically and preferably, each of the pair of patterned photoresist layers 24a and 24b is formed to a thickness of from about 10 to about 10000 angstroms to define a second aperture larger than and completely overlapping the first aperture defined by the pair of patterned first etch stop layers 14a and 14b, where the second aperture is employed for defining a trench within the blanket second dielectric layer 20 larger than and completely overlapping the via to be formed through the blanket first dielectric layer 16 and the blanket first etch stop layer 14.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein through use of a first plasma etch method the blanket polish stop layer 22 has been patterned to form a pair of patterned polish stop layers 22a and 22b while employing the pair of patterned photoresist layers 24a and 24b as a first etch mask layer. Similarly, and as is also illustrated within the schematic cross-sectional diagram of FIG. 2 through subsequent use of a second plasma etch method: (1) the blanket second dielectric layer 20 has been patterned to form a pair of patterned second dielectric layers 20a and 20b while employing at least the pair of patterned polish stop layers 22a and 22b as a second etch mask layer; and (2) the blanket first dielectric layer 16 has been patterned to form the pair of patterned first dielectric layers 16a and 16b while employing the pair of patterned second etch stop layers 18a and 18b as a third etch mask layer. Finally, and as is also illustrated within the schematic cross-sectional diagram of FIG. 2, through use of a subsequent third plasm etch method: (1) the pair of patterned second etch stop layers 18a and 18b is further patterned to form a pair of twice patterned second etch stop layers 18a' and 18b' while employing at least the pair of patterned second dielectric layers 20a and 20b as a fourth etch mask; and (2) the blanket first etch stop layer 14 is patterned to form a pair of patterned first etch stop layers 14a and 14b while employing at least the pair of patterned first dielectric layers 16a and 16b as a fifth etch mask layer. In addition, the pair of patterned photoresist layers 24a and 24b as illustrated within the microelectronic fabrication whose schematic cross-sectional diagram is illustrated in FIG. 1 has also been stripped therefrom to provide in part the microelectronic fabrication whose schematic cross-sectional diagram is illustrated in FIG. 2.

Within the preferred embodiment of the present invention, each of the foregoing blanket layers or patterned layers may be patterned to form the corresponding patterned layers or twice patterned layers, typically and preferably while employing plasma etch methods as are otherwise conventional in the art of microelectronic fabrication, where such plasma etch methods will typically comprise in order, a fluorine based plasma etch method, followed by an oxygen based plasma etch method in turn followed by a second fluorine based plasma etch method, under conditions where the blanket first dielectric layer 16 and the blanket second dielectric layer 20 are formed of an oxygen containing plasma etchable low dielectric constant dielectric material.

As is understood by a person skilled in the art, and as is illustrated within the schematic cross-sectional diagram of FIG. 2, the pair of patterned first etch stop layers 14a and 14b in conjunction with the pair of patterned first dielectric layers 16a and 16b define a via 15, as discussed above, while the pair of twice patterned second etch stop layers 18a' and 18b', the pair of patterned second dielectric layers 20a and 20b and the pair of patterned polish stop layers 22a and 22b define a trench 19 larger than and completely overlapping the via 15, as also discussed above.

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein there is formed within the via 15 smaller than and completely overlapped by the trench 19 a contiguous patterned conductor stud layer and patterned conductor interconnect layer 26.

Within the preferred embodiment of the present invention, the contiguous patterned conductor stud layer and patterned conductor interconnect layer 26 may be formed from any of several conductor materials as are conventional or non-conventional in the art of microelectronic fabrication, including but not limited to metal, metal alloy, doped polysilicon (having a dopant concentration of greater than about $10^4$ dopant atoms per cubic centimeter) and polycide (doped polysilicon/metal silicide stack) conductor materials. Within the preferred embodiment of the present invention, more particularly, the contiguous patterned conductor stud layer and patterned conductor interconnect layer 26 is formed of a copper or copper alloy conductor material along with an appropriate barrier material.

Upon forming the microelectronic fabrication whose schematic cross-sectional diagram is illustrated in FIG. 3, there is formed in accord with the preferred embodiment of the present invention a microelectronic conductor structure comprising a patterned microelectronic conductor layer (presuming formation within the microelectronic fabrication whose schematic cross-sectional diagram is illustrated in FIG. 3 of a multiplicity of vias 15, trenches 19 and contiguous patterned conductor stud layers and patterned conductor interconnect layers 26) having interposed between its patterns a patterned microelectronic dielectric layer formed of a low dielectric constant dielectric material, where the microelectronic conductor structure has enhanced adhesion and attenuated electrical leakage. The microelectronic conductor structure of the present invention realizes the foregoing object by employing when forming the microelectronic conductor structure, and formed over a substrate, a silicon carbide layer having formed thereupon a silicon nitride layer in turn having formed thereupon a patterned low dielectric constant dielectric layer interposed between whose patterns is a patterned conductor layer.

EXAMPLES

There was fabricated four series of microelectronic fabrications generally in accord with the microelectronic fabrication whose schematic cross-sectional diagram is illustrated in FIG. 3. The series of microelectronic fabrications employed for both a series of patterned first etch stop layers, analogous with the series of patterned first etch stop layer 14a and 14b, and a series of twice patterned second etch stop layers, analogous with the series of twice patterned second etch stop layers 18a and 18b, one of the four following materials combinations: (1) a silicon carbide layer of thickness about 500; (2) a silicon nitride layer of thickness about 500 angstroms; (3) a laminate of a silicon carbide layer of thickness about 300 angstroms having formed thereupon a silicon nitride layer of thickness about 200 angstroms; and (4) a laminate of a silicon carbide layer of thickness about 300 angstroms having formed thereupon an aminosilane adhesion promoter layer of thickness about 200 angstroms.

Each of the four series of microelectronic fabrications also employed for a pair of patterned first dielectric layers, analogous with the pair of patterned first dielectric layers 16a and 16b, and a pair of patterned second dielectric layers, analogous with the pair of patterned second dielectric layers 20a and 20b, a hydrogen silsesquioxane (HSQ) low dielectric constant dielectric material formed to a thickness of about 5000 angstroms. Finally, each of the four series of microelectronic fabrications employed a contiguous patterned conductor stud layer and patterned conductor interconnect layer, analogous with the contiguous patterned conductor stud layer and patterned conductor interconnect layer 26, formed of a copper conductor material formed upon a tantalum nitride barrier material.

One microelectronic fabrication from each of the four series of microelectronic fabrications was subjected to an elevated stress environment at a temperature of about 25 degrees centigrade and a humidity of about 40 percent for a time period of about 4 hours. Following cross-sectional inspection of each of the four microelectronic fabrications so stressed it was determined that the microelectronic fabrication fabricated employing as the pair of etch stop layers the silicon carbide layers only suffered from elevated stress environment delamination, whereas the remaining three microelectronic fabrications did not.

The four microelectronic fabrications were also subjected to electrical stress at 20 volts in order to ascertain electrical leakage.

Figure 4:
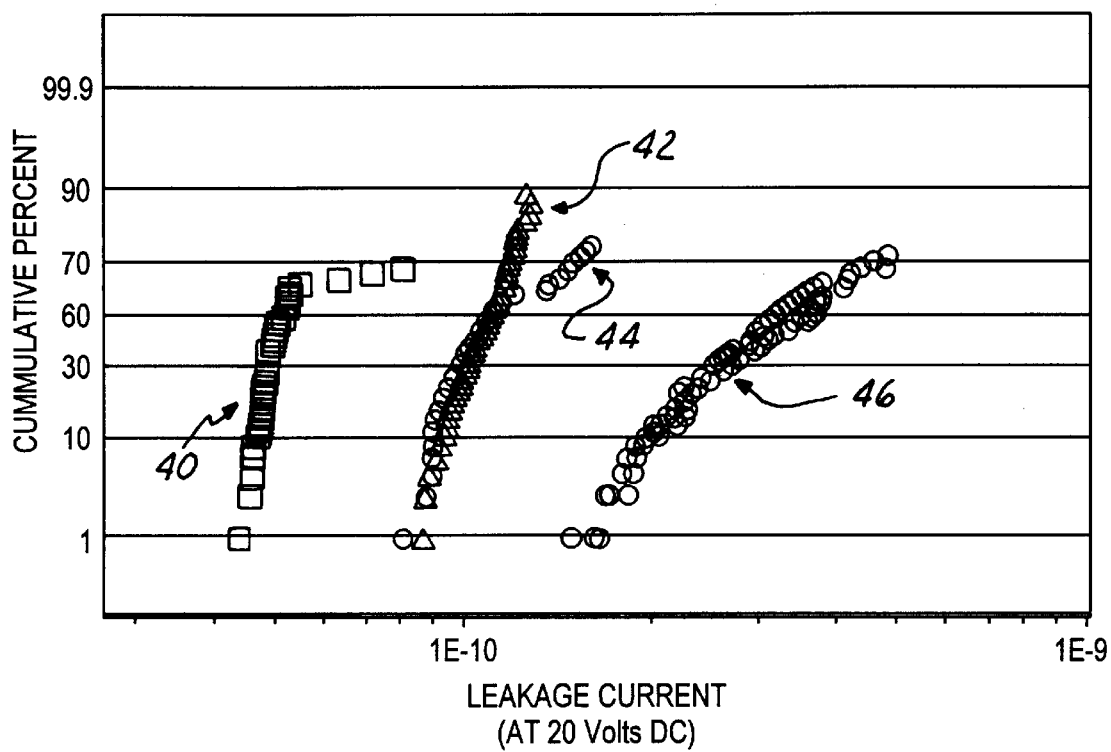
FIG. 4 shows a graph of Cumulative Percent versus Leakage Current for a series of microelectronic conductor structures including a microelectronic conductor structure formed in accord with the present invention.

The results of those measurements are illustrated in FIG. 4, which shows a graph of Cumulative Percent versus Leakage Current. Within the graph of FIG. 4, the data points corresponding with reference numeral 40 correspond with leakage currents for the microelectronic fabrication fabricated with etch stop layers formed of silicon carbide only. In addition, within the graph of FIG. 4, the data points corresponding with reference numeral 42 correspond with leakage currents for the microelectronic fabrication fabricated with etch stop layers formed of silicon carbide having laminated thereupon silicon nitride. Further, within the graph of FIG. 4, the data points corresponding with reference numeral 44 correspond with leakage currents for the microelectronic fabrication fabricated with etch stop layers formed of silicon nitride only. Finally, within the graph of FIG. 4, the data points corresponding with reference numeral 46 correspond with leakage currents for the microelectronic fabrication fabricated with etch stop layers formed of silicon carbide having laminated thereupon the aminosilane adhesion promoter agent.

As is clearly illustrated within the schematic cross-sectional diagram of FIG. 4, of the remaining three microelectronic fabrications which do not suffer from environmentally stressed delamination, the microelectronic fabrications fabricated with etch stop layers formed of either silicon nitride or silicon carbide laminated with silicon nitride provide a considerably lower leakage current than the microelectronic fabrication fabricated with etch stop layers formed of silicon carbide having laminated thereto the aminosilane adhesion promoter agent. Similarly, insofar as a silicon carbide layer may have other preferable physical, mechanical or electrical properties in comparison with a silicon nitride layer, an etch stop layer formed employing a silicon carbon layer having laminated thereto a silicon nitride layer as employed beneath a low dielectric constant dielectric layer may have uniquely desirable properties in accord with the present invention.

As is understood by a person skilled in the art, the preferred embodiment and examples of the present invention are illustrative of the present invention rather than limiting of the present invention. Revisions and modifications may be made to methods, materials, structures and dimensions through which is provided a microelectronic fabrication in accord with the preferred embodiment and examples of the present invention while still providing a microelectronic conductor structure in accord with the present invention, and a method for fabrication thereof, further in accord with the accompanying claims.

What is claimed is:

1. A microelectronic conductor structure comprising:
    a substrate;
    a silicon carbide layer formed over the substrate;
    a silicon nitride layer formed upon the silicon carbide layer;
    a patterned low dielectric constant dielectric layer formed upon the silicon nitride layer; and
    a patterned conductor layer formed interposed between the patterns of the patterned low dielectric constant dielectric layer.

2. The microelectronic conductor structure of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The microelectronic conductor structure of claim 1 wherein the silicon carbide layer is formed to a thickness of from about 10 to about 1000 angstroms.

4. The microelectronic conductor structure of claim 1 wherein the silicon nitride layer is formed to a thickness of from about 10 to about 1000 angstroms.

5. The microelectronic conductor structure of claim 1 wherein the patterned low dielectric constant dielectric layer is formed from a low dielectric constant dielectric material selected from the group consisting of spin-on-polymer (SOP) dielectric materials, spin-on-glass (SOG) dielectric materials, amorphous carbon dielectric materials, fluorosilicate glass (FSG) dielectric materials and aerogel dielectric materials.

6. The microelectronic conductor structure of claim 1 wherein the patterned conductor layer is formed from a conductor material selected from the group consisting of metal, metal alloy, doped polysilicon and polycide conductor materials.

7. A method for forming a microelectronic conductor structure comprising:
    providing a substrate;
    forming over the substrate a silicon carbide layer;
    forming upon the silicon carbide layer a silicon nitride layer;
    forming upon the silicon nitride layer a patterned low dielectric constant dielectric layer; and
    forming interposed between the patterns of the patterned low dielectric constant dielectric layer a patterned conductor layer.

8. The method of claim 7 wherein by employing the silicon nitride layer formed upon the silicon carbide layer the microelectronic conductor structure is formed with enhanced adhesion and attenuated electrical leakage.

9. The method of claim 7 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

10. The method of claim 7 wherein the silicon carbide layer is formed to a thickness of from about 10 to about 1000 angstroms.

11. The method of claim 7 wherein the silicon nitride layer is formed to a thickness of from about 10 to about 1000 angstroms.

12. The method of claim 7 wherein the patterned low dielectric constant dielectric layer is formed from a low dielectric constant dielectric material selected from the group consisting of spin-on-polymer (SOP) dielectric materials, spin-on-glass (SOG) dielectric materials, amorphous carbon dielectric materials, fluorosilicate glass (FSG) dielectric materials and aerogel dielectric materials.

13. The method of claim 7 wherein the patterned conductor layer is formed from a conductor material selected from the group consisting of metal, metal alloy, doped polysilicon and polycide conductor materials.

14. The method of claim 7 wherein the silicon nitride layer is formed employing a method selected from the group consisting of ex-situ deposition methods, in-situ deposition methods, thermal nitridation methods and plasma nitridation methods.

15. The method of claim 7 wherein the patterned low dielectric constant dielectric layer is formed before the patterned conductor layer.

16. The method of claim 7 wherein the patterned low dielectric constant dielectric layer is formed after the patterned conductor layer.

* * * * *